United States Patent [19]

Yamada et al.

[11] Patent Number: 4,904,885
[45] Date of Patent: Feb. 27, 1990

[54] SUBSTRATE BIAS CIRCUIT HAVING SUBSTRATE BIAS VOLTAGE CLAMP AND OPERATING METHOD THEREFOR

[75] Inventors: Michihiro Yamada; Hiroshi Miyamoto; Tadato Yamagata; Shigeru Mori; Tetsuya Aono, all of Hyogo, Japan

[73] Assignee: Mitsubishi Denki Kabushiki Kaisha, Tokyo, Japan

[21] Appl. No.: 204,126

[22] Filed: Jun. 6, 1988

[30] Foreign Application Priority Data

Jun. 10, 1987 [JP] Japan ................................ 62-145844

[51] Int. Cl.4 .......................... H03K 3/01; H03K 3/353
[52] U.S. Cl. .................................... 307/296.2; 307/304
[58] Field of Search ................... 307/396.2, 304, 272.3

[56] References Cited

U.S. PATENT DOCUMENTS

| 3,940,747 | 2/1976 | Kuo t al. ................ | 340/173 DR |
| 4,439,692 | 3/1984 | Beekmans et al. .......... | 307/297 |
| 4,631,421 | 12/1986 | Inoue et al. .............. | 307/297 |
| 4,670,668 | 6/1987 | Liu ......................... | 307/296 R |
| 4,798,974 | 1/1989 | Reczek et al. ............. | 307/296 R |

OTHER PUBLICATIONS

IEDM 1985: "Status and Transient Latch-Up Hardness in N-Well On-Chip Substrate Bias Generator", by D. Takacs et al., 18.5, 1985, pp. 504-508.

Primary Examiner—Stanley D. Miller
Assistant Examiner—Richard Roseen
Attorney, Agent, or Firm—Lowe, Price, LeBlanc, Becker & Shur

[57] ABSTRACT

A substrate bias circuit controls application of a conventional substrate charge pump to the substrate of a semiconductor integrated circuit to prevent latching up of parasitic transistors at the time of turn on of power to the integrated circuit. The substrate bias circuit comprises a filed effect transistor having its source and drain electrodes connected between substrate and charge pump. The gate electrode of the transistor is driven through an RC circuit by the power supply to turn on the transistor for a predetermined time period at the time power is initially applied to the integrated circuit. There is no latching up of the parasitic transistors because application of positive bias voltage to the substrate during turn-on is prevented.

8 Claims, 10 Drawing Sheets

MEMORY CELL PORTION

SUBSTRATE BIAS CIRCUIT HAVING SUBSTRATE BIAS VOLTAGE CLAMP AND OPERATING METHOD THEREFOR

BACKGROUND OF THE INVENTION

1. Field of the Invention

The invention relates generally to biasing the substrate of a semiconductor integrated circuits containing field effect devices, and more particularly, to a method of and apparatus for controlling substrate bias voltage to prevent latching up of parasitic transistors at the time of circuit turn on.

2. Description of the Prior Art

The present invention is applicable to a MOS type semiconductor memory comprising a MOS transistor, and particularly to a MOS dynamic RAM (Random Access Memory).

A description is made hereinafter as to the MOS dynamic RAM which is a background of the present invention.

FIG. 1A is a block diagram showing an example of a simplified circuit of a conventional 1 M bit dynamic RAM (Random Access Memory) having 1048576 memory cells. Referring to FIG. 1A, a summary of the basic operation of the dynamic RAM will be hereinafter described.

A clock generator 10 receives an RAS (Row Address Strobe) signal, CAS (Column Address Strobe) signal from a CPU (Central Processing Unit) and generates clock signals $\phi_1$ and $\phi_2$. In the normal read/write operation of the dynamic RAM, an address buffer 21 receives external address inputs. $A_0$ to $A_9$ on a time share basis and applies internal address signals $A_0$ to $A_9$ on a time share basis to a row decoder 22 and a column decoder 23. The row decoder 22 and the column decoder 23 decode the internal address signals $A_0$ to $A_9$ and apply the decoded signals to a memory cell array 25 and an I/O control 24. The writing operation of the input data and the reading operation of the output data are carried out for a memory cell having the address designated as described above. The data in buffers 26 receives the input data and transfers the input data to the memory cell array 25 via the I/O control 24 and the sense amplifiers in response to a clock signal. On the other hand, the data out buffers 27 receive the data from the memory cell array 25 via the sense amplifiers and the I/O control 24 and outputs the output data in response to the clock signal.

FIG. 1B is a block diagram showing a major portion of a conventional dynamic RAM.

Referring to FIG. 1B, the major portion of dynamic RAM comprises an array comprising a plurality of memory cells serving as memory portions, row decoder and a column decoder for selecting an address of each memory cell, and a peripheral circuit portion comprising a sense amplifier connected to data in/out buffers. The plurality of memory cells serving as memory portions are each connected to intersection points of word lines connected to the row decoder and bit lines connected to the column decoder, these word and bit lines constituting a matrix. The above-mentioned array is thus implemented.

Next, an operation of the dynamic RAM is described. When a word line and a bit line are selected by the row decoder and the column decoder in response to a row address signal and a column address signal externally provided, a memory cell at the intersection point of the word line and the bit line is selected, and information is read from or written in the memory cell through the sense amplifier. As to the detail explanation of dynamic RAM, U.S. Pat. No. 3,940,747, entitled "High Density, High Speed Random Access Read-Write Memory" can be referred to.

In this invention, other portion than memory cell 25 in FIG. 1A is to be defined as a peripheral circuit hereinafter.

FIG. 2 is a drawing showing a cross section of a memory cell in the memory cell portion 25 and an equivalent circuit thereof.

The memory cell portion of the dynamic RAM is formed of a transistor and a capacitance. As shown in FIG. 2, the transistor comprises a MOS transistor 31 of an n channel type and the capacitance comprises a cell plate 32 and an n+ layer 33.

Fig. 3A is a drawing showing a cross section of a peripheral circuit such as row and column address buffer 21, clock generator circuit 10 and so on, and an equivalent circuit thereof. The peripheral circuit portion is generally formed of a CMOS inverter.

FIG. 3B is an equivalent circuit of the peripheral circuit shown in FIG. 3A and prepared for explaining parasitic bipolar transistors and a parasitic capacitance being parasitic on the MOS dynamic RAM.

Referring to FIG. 3A and 3B, a substrate bias voltage $V_{BB}$ is applied to a p type silicon substrate 20 through a substrate bias conductor 4. The substrate bias voltage $V_{BB}$ is generated from a $V_{BB}$ generating circuit 3 (shown in FIG. 4) provided on a RAM chip. A p channel MOS transistor is formed in an n-well 21 formed in the p type silicon substrate 20. An n+ diffused layer 22 serves to fix a voltage of n-well 21 to a supply voltage $V_{CC}$, which is connected to a $V_{CC}$ power supply conductor. An n+ diffused layer 23 is formed in the p type silicon substrate 20 and it is connected to the $V_{CC}$ power supply conductor. An n+ diffused layer 24 is formed in the p type silicon substrate 20 and it is connected to a ground conductor $V_{SS}$.

As seen from the drawing, a p-n junction capacitance C well formed between the n-well 21 and the p type silicon substrate 20 and a p-n junction capacitance Cn+ formed between the n+ diffused layer 23 and the p type silicon substrate 20 form a component of the parasitic capacitance.

Referring to FIG. 3B, a mechanism of the latching-up is explained. The peripheral circuit comprises phantom bipolar transistor $Tr_1$ (pnp transistor) coupled between the power supply conductor $V_{CC}$ and $V_{BB}$ generating circuit through resistance $R_2$, a phantom bipolar transistor $Tr_2$ (npn transistor) coupled between the power supply conductor $V_{CC}$ through a resistance $R_1$ and the ground conductor $V_{SS}$, parasitic capacitance 6 coupled between the power supply conductor $V_{CC}$ and the $V_{BB}$ generating circuit, and a substrate bias $V_{BB}$ generating circuit coupled between the power supply conductor $V_{CC}$ and the ground conductor $V_{SS}$. The substrate bias $V_{BB}$ generating circuit is provided to provide a predetermined negative bias voltage to the substrate.

$Tr_1$ comprises a p+ diffusion layer in an n-well, an n+ diffusion layer 22 in the n-well and the substrate itself. $Tr_2$ comprises an n+ diffusion layer 24, the substrate itself and n+ diffusion layer 22 in the n-well. The C well is formed between n-well 21 and the substrate 20. $V_{BB}$ generating circuit usually keeps the substrate at −3 V. A reversed bias is applied between a base and an emitter of the transistor $Tr_2$. Transistor $Tr_2$ is in off state. Therefore, no voltage is applied between the base and the emitter of transistor $Tr_1$ and transistor $Tr_1$ is also in off state. When the substrate bias voltage $V_{BB}$ becomes a certain positive value, forward bias voltage is applied to the p-n junction and the latching-up occurs. Following is an example that causes the $V_{BB}$ to become a positive value. When power supply is raised from 0 volt to the predetermined positive value, for example, 5 volts, $V_{BB}$ can be a positive value due to a capacitance coupling caused by the parasitic capacitance 6. When $V_{BB}$ becomes a positive value, forward bias voltage is applied between the base and the emitter of the transistor $Tr_2$ and transistor $Tr_2$ turns on. A current flows from the power supply conductor $V_{CC}$ to the ground conductor $V_{SS}$ through the resistance $R_1$ and the transistor $Tr_2$. As there is the resistance $R_1$ and the substrate, potential drops occur and a forward bias voltage is applied between the base and the emitter of the transistor $Tr_1$. As a result, the transistor $Tr_1$ turns on. A current flows to the base of the transistor $Tr_2$ and the $Tr_2$ is kept turning on (corresponding to the state ① shown in FIG. 3B). As there is the resistance $R_1$ in the substrate, $Tr_1$ is kept turning on (corresponding to the state ② shown in FIG. 3B). States ① and ② occurs continuously and a current continues to flow from the power supply conductor $V_{CC}$ to the ground conductor $V_{SS}$. This phenomenon is called a latch-up.

FIG. 4 is a drawing showing a typical $V_{BB}$ generating circuit. $V_{BB}$ generating circuit comprises a ring oscillator consisting of an odd numbers of inverters connected in series in a ring manner and a charge pump circuit consisting of two diode connected n-channel MOS transistors $Q_{20}$, $Q_{21}$. The oscillator is connected with the charge pump at a node $N_A$ through a capacitor $C_A$. MOS transistor $Q_{20}$ is connected between the node $N_A$ and a ground conductor $V_{SS}$. A MOS transistor $Q_{21}$ is connected between the node $N_A$ and the substrate bias conductor $V_{BB}$.

FIG. 5 is a timing diagram showing potential change of $V_{BB}$ and prepared to explain an operation of the $V_{BB}$ generating circuit. $\phi$ is a potential at the node $\phi$ (shown in FIG. 4). $N_A$ is a potential at the node $N_A$ (shown in FIG. 4), and $V_{BB}$ is a potential of the $V_{BB}$ conductor.

When time is $t_0$, potential of the node $N_A$ and the $V_{BB}$ conductor is 0 volt. When time is $t_1$, potential at $\phi$ is raised from "L" to "H". The potential at node $N_A$ is boosted to the positive value due to the capacitance coupling of the capacitor $C_A$. Then MOS transistor $Q_{20}$ begins to turn on and the potential at node $N_A$ begins to be lowered from the raised positive voltage to 0 volt. When the potential at node $N_A$ is $V_{TH}$ ($t=t_2$), corresponding to the threshold voltage of the MOS transistor $Q_{20}$, MOS transistor $Q_{20}$ turns off. The potential at node $N_A$ is kept at the $V_{TH}$ level. As MOS transistor $Q_{21}$ is kept at off state during above operation, the potential of the $V_{BB}$ conductor is kept 0 volt. When time is $t_3$, the potential at $\phi$ is lowered from "H" to "L". The potential at $N_A$ is lowered also due to the capacitance coupling of the capacitor $C_A$. Then MOS transistor $Q_{21}$ begins to turn on, and the current flows from the $V_{BB}$ conductor to the node $N_A$. The potential at the node $N_A$ begins to be raised to 0 volt and the potential at the $V_{BB}$ conductor is lowered a little to the negative voltage. When the potential at node $N_A$ is $-V_{TH}$, (time $t=t_4$), MOS transistor $Q_{21}$ turns off. The potential at node $N_A$ is kept at $-V_{TH}$ and the MOS transistor $Q_{20}$ is kept at the off state during above operation. By repeating above operation, the potential of the $V_{BB}$ conductor gradually becomes negative and theoretically, it saturates at the level of $-(V_{CC}-2V_{TH})$.

The substrate bias circuit is provided on the dynamic RAM for the following purposes.

The negative substrate bias is necessary to prevent the electron injection problem. In dynamic RAM circuits, some n-p junctions become a little bit (max. $-2$ volts) forward biasing condition if the substrate potential is 0 volt. Forward biasing condition occurs in two cases. One case occurs in data input circuits which are in general the electro-static discharge absorbing circuit. As shown in FIG. 6A, input signals such as address and RAS/CAS control signals (showing in FIG. 1A) are supplied to n-p junctions from the outside of a memory chip. At that time, the input pulse gives rise to the undershoot because of the parasitic capacitance. This voltage undershoot up to $-2$ volts is usually allowed as shown in FIG. 6B. In other words, the commercial dynamic DRAM should be operated normally for the undershooted input pulses up to $-2$ volts.

The other case occurs in the capacitance coupled circuits (FIG. 6C). In this case, voltage undershoot occurs at the n-p junction as shown in FIG. 6D.

Therefore in both cases, if the p-substrate was not biased to more negative than $-2$ volts, these n-p junctions will become forward bias condition for a diode during the period of the undershoot. This means that a large quantity of electrons are injected in the substrate. Some of them will drift toward the memory cell capacitor and cause the "High" to "Low" error.

The most effective and popular way to prevent this problem is the application of negative ($> -2$ volts) bias to the substrate. If the substrate is biased to, for example, $-3$ volts, forward bias condition will never occur.

There are some another advantages of the negative bias. The MOS circuit operation speed is improved because of the reduction of the junction capacitance. The width of the depletion layer becomes wider when the substrate is biased to negative potential for n-channel MOS transistor. The junction capacitance falls off at the inverse root of the reverse bias $V_R$ between the junction.

$$C_{junction} \alpha \ (V_R) - \tfrac{1}{2}$$

The decrease of the junction capacitance is also useful to decrease the bit line capacitance. Bit line capacitances is one of the key parameters for dynamic RAM operation. Smaller bit line capacitance is better to improve the noise margin of dynamic RAM.

A conventional substrate bias circuit of a MOS dynamic RAM is disclosed in IEDM 85 pp. 504–508, entitled "Static and Transient Latch-up Hardness in N-well CMOS on-chip Substrate Bias Generator" by D. Takacs et al.

FIG. 7 shows the substrate bias circuit disclosed therein. The substrate bias circuit comprises a $V_{CC}$ power supply conductor 1 to which the supply voltage $V_{CC}$ is applied, a ground conductor 2 to which a reference voltage $V_{SS}$ of a ground level (0V) is applied, a substrate bias $V_{BB}$ generating circuit 3 provided on the chip of the MOS dynamic RAM (referred to as a RAM chip hereinafter), a substrate bias conductor 4, a substrate bias voltage control circuit 5, and a capacitor 6 existing between the $V_{CC}$ power supply conductor 1 and the substrate bias conductor 4. The capacitor 6 corresponds to the parasitic capacitance described in connection with FIG. 3A and 3B.

The substrate bias voltage $V_{BB}$ generating circuit 3 generates a negative substrate bias $V_{BB}$. The substrate bias voltage $V_{BB}$ as the output of the $V_{BB}$ generating circuit 3 is applied to the substrate bias conductor 4. The substrate bias voltage control circuit 5, made of MOS transistor, having its gate and drain connected to the substrate bias conductor 4 and its source connected to the ground conductor 2.

Now a description is made of an operation of the substrate bias circuit which is performed when the supply voltage VCC is turned on in reference to FIG. 8.

The supply voltage $V_{CC}$ starts to be applied at a time $t_0$. The supply voltage $V_{CC}$ gradually rises from 0V toward a preset positive value for example, 5V from the time $t_0$ to a time $t_2$. At this time, the substrate bias voltage $V_{BB}$ is boosted up from 0V to a positive value by capacitance coupling of the capacitor 6. The value of the $V_{BB}$ exceeds a threshold voltage $V_{TH}$ of the MOS transistor 5 and forms $V_{BB}$ spike at a time $t_1$. As a result, the MOS transistor 5 turns on and the value of the $V_{BB}$ is prevented from being boosted up above the $V_{TH}$. Therefore, the value of the $V_{BB}$ is clamped at the value of the $V_{TH}$ in a period from the time $t_1$ to a time $t_3$. At the time $t_3$, the $V_{BB}$ generating circuit 3 starts to be operated. The value of the $V_{BB}$ falls to a negative value and at a time $t_4$ the value of the $V_{BB}$ becomes stable.

The conventional substrate bias circuit is structured as described above. Therefore, it involves a disadvantage that the level at which the substrate bias voltage $V_{BB}$ is clamped when the supply voltage $V_{CC}$ is turned on depends on the threshold voltage $V_{TH}$ of the MOS transistor 5.

The value of the $V_{TH}$ must be $V_{TH}<V_F$ ($V_F$ is a forward voltage of the p-n junction and approximately 0.6V). The reason for this is that if the value of the $V_{TH}$ of the MOS transistor 5 is $V_{TH}>V_F$, the p-n junction formed between the p type silicon substrate 20 and the n+ diffused layer 24 is caused to be in a forward bias (referring to FIG. 3) when the supply voltage $V_{CC}$ is turned on. More specifically, this induces the latch-up in the CMOS when the p-n junction is caused to be in the forward bias.

In FIG. 8, an operating point of the MOS transistor 5 in the period from the time $t_1$ to the time $t_3$ is in a saturation region in which the voltage between the gate and the source is around $V_{TH}$. Therefore, the MOS transistor 5 cannot be in a sufficiently low impedance state. As a result, when the power supply is turned on to cause the supply voltage $V_{CC}$ to rise steeply, the $V_{BB}$ is boosted up by the capacitance coupling of the capacitor 6. Consequently, the value of the $V_{BB}$ could change instantaneously to a positive value above the $V_{TH}$ around the time $t_1$. The reason for such change is that the effect of boosting up of the $V_{BB}$ by the capacitance coupling of the capacitor 6 exceeds the impedance of clamping the $V_{BB}$ to the level of the $V_{TH}$ by the MOS transistor 5.

In this case, the p-n junction between of the p type silicon substrate 20 and the n+ diffused layer 24 is caused to be in the forward bias (referring to FIG. 3B), resulting in latch-up in the CMOS.

SUMMARY OF THE INVENTION

One object of the invention is to provide a method of and circuitry for preventing latching up of parasitic transistors in a semiconductor integrated circuit containing field effect devices.

Another object of the invention is to provide a method of and circuit for preventing, in a semiconductor integrated circuit containing field effect devices, latching up of parasitic transistors that tends to occur at the time of turn on of the integrated circuit.

Another object is to provide a method of and circuit for preventing, in a dynamic access memory integrated circuit containing field effect devices, latching up of parasitic transistors that tends to occur at the time of turn on of the integrated circuit.

A further object is to provide a substrate bias voltage clamp that is independent of transistor threshold voltages.

A still further object of the invention is to provide a method of and circuit for substrate bias voltage clamping that avoid development of any positive substrate voltage as a result of the effect of saturation region operation of conventional diode type substrate clamps.

The above-mentioned objects of the present invention can be attained by substrate bias voltage control circuit comprising: a switch for connecting substrate bias terminal connected to a substrate bias generating circuit to ground terminal, a time delay circuit for establishing a predetermined time duration, and a control circuit responsive to a change of voltage at the power supply terminal and to the time delay circuit for turning on the switch for predetermined time duration upon application of an external voltage to the power supply terminal.

Since the substrate bias voltage control circuit in accordance with the present invention is thus structured, latch-up of parasitic transistors in a semiconductor integrated circuit containing field effect devices can be prevented.

In a preferred embodiment, the control circuit includes a circuit for establishing a current charging pass, between the power supply terminal and a control electrode of the switch, to limit a turn-on time of the switch in response to the external voltage. The current charging pass establishing circuit comprises a capacitor.

Since the substrate bias voltage control circuit in the preferred embodiment is structured as described above, the substrate bias voltage is clamped at 0V at the time of turning on of the power supply.

In another preferred embodiment, a method of controlling the substrate bias voltage to prevent latching-up of the semiconductor device upon application of an external voltage to the power supply terminal, comprising the steps of: detecting an application of the external voltage to the power supply terminal, and in response connecting the substrate bias terminal to the ground terminal whereby said substrate is maintained at the ground potential, and, following a predetermined time duration, disconnecting the substrate bias terminal from the ground terminal, whereby the substrate is biased by the substrate bias voltage.

Since the method of controlling substrate bias voltage comprises above described steps, a method for preventing latching-up of parasitic transistors in a semiconductor integrated circuit containing field effect devices can be provided.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
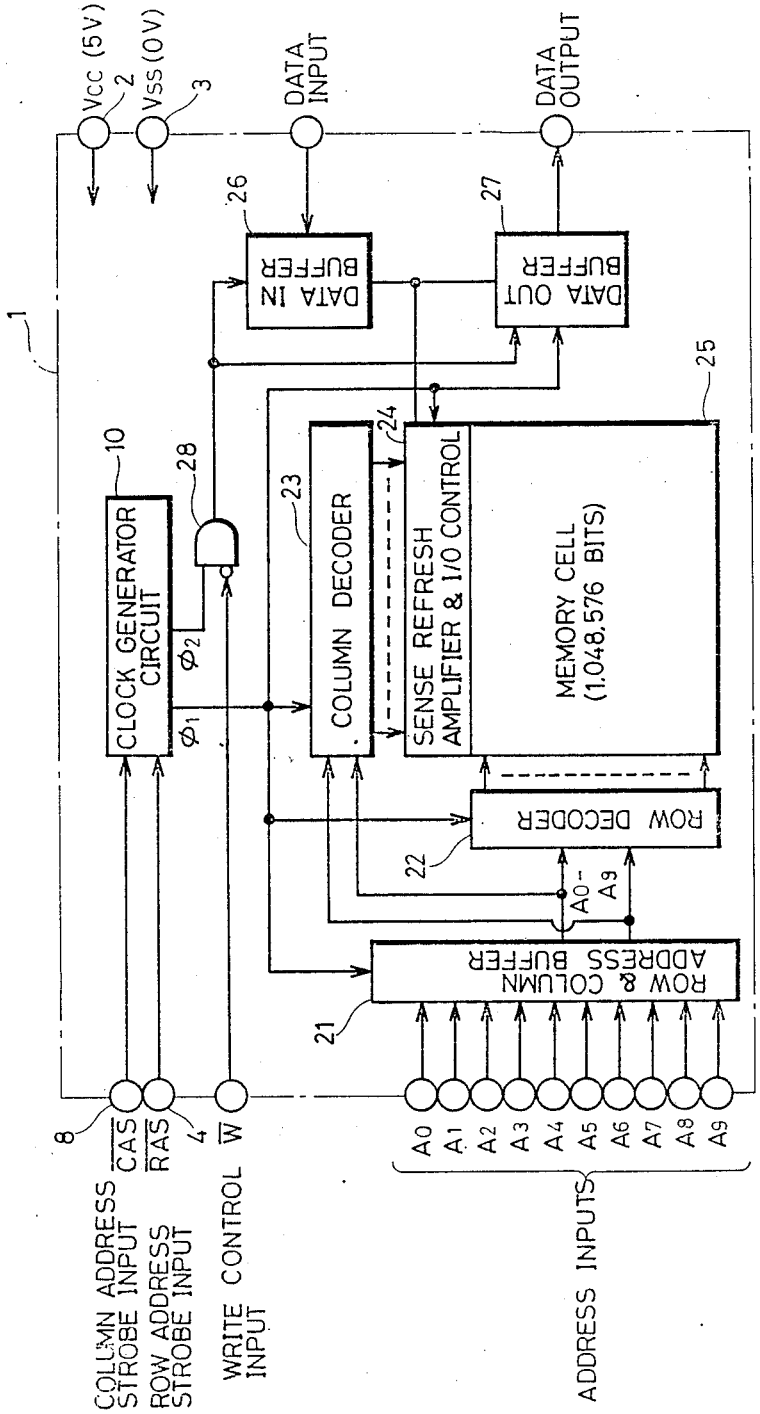
FIG. 1A a block diagram showing an example of a simplified circuit of a conventional 1 M bit dynamic RAM.
Figure 1B:
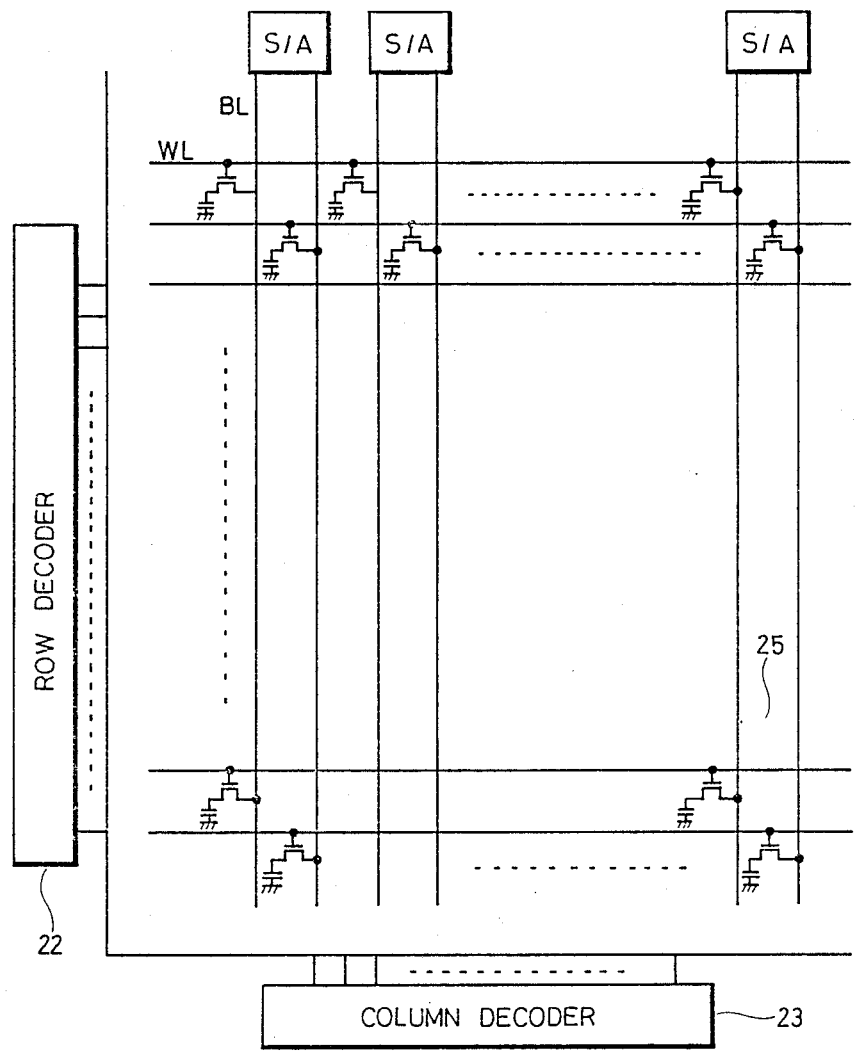
FIG. 1B is a block diagram showing a major portion of a conventional dynamic RAM.
Figure 2:
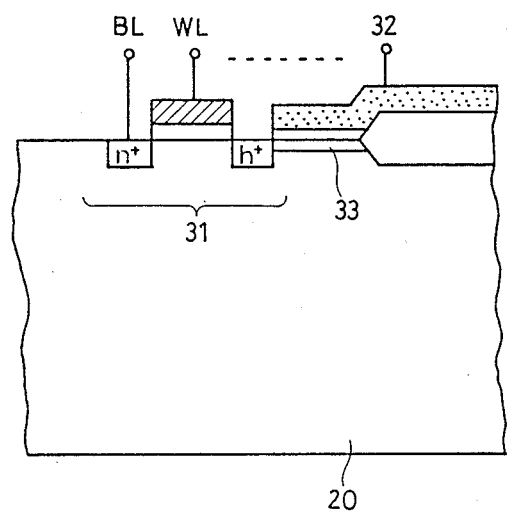
FIG. 2 is a drawing showing a cross section of a memory cell.
Figure 2:
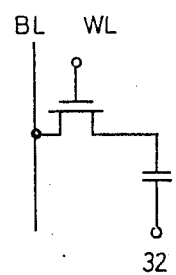
Figure 3A:
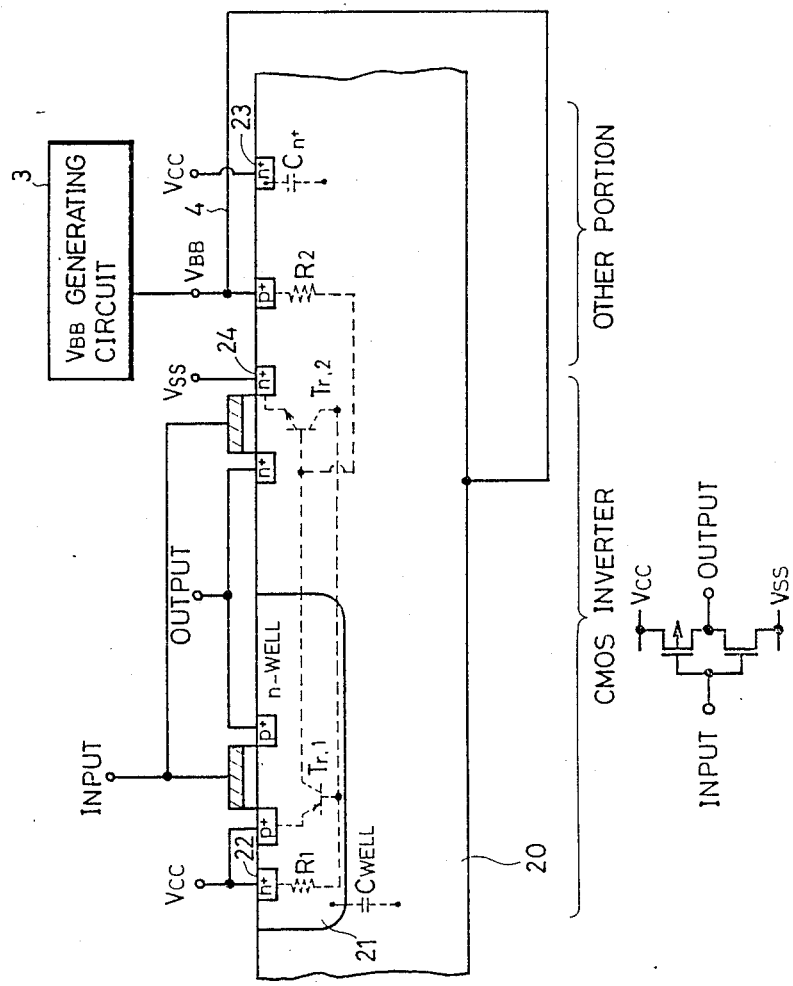
FIG. 3A is a drawing showing a cross section of a peripheral circuit.
Figure 3B:
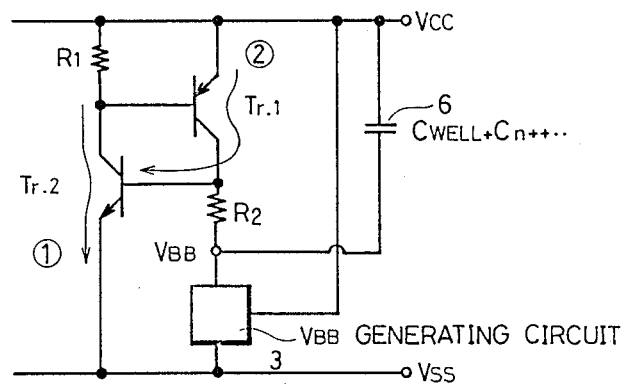
FIG. 3B is an equivalent circuit of a peripheral circuit shown in FIG. 3A.
Figure 4:
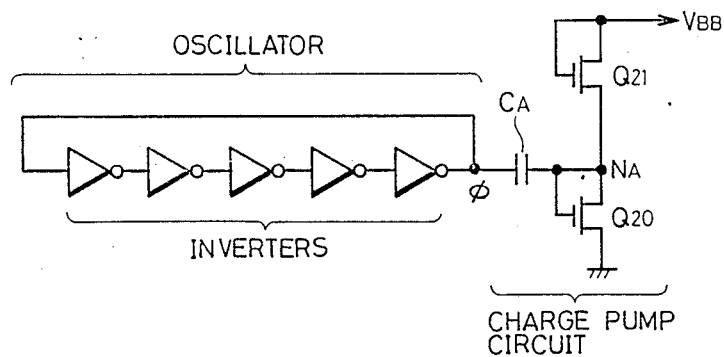
FIG. 4 is a drawing showing a typical $V_{BB}$ generating circuit.
Figure 5:
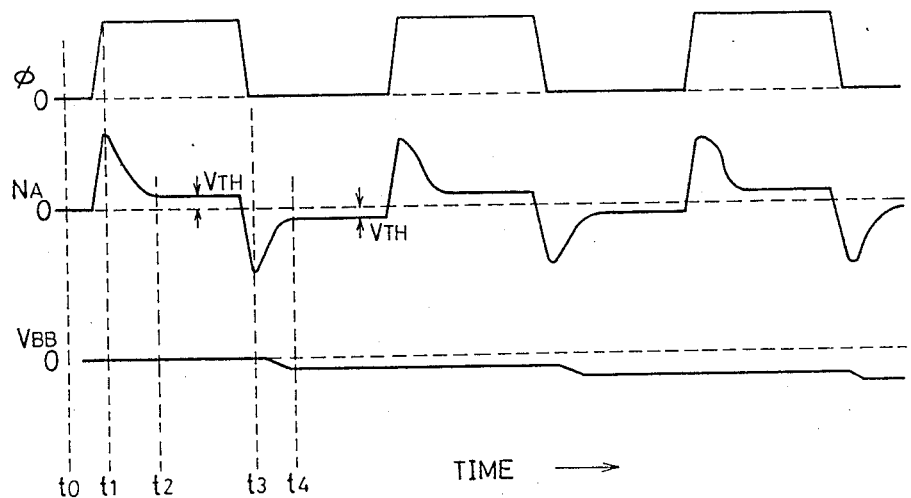
FIG. 5 is a graph showing a potential change of $V_{BB}$.
Figure 6A:
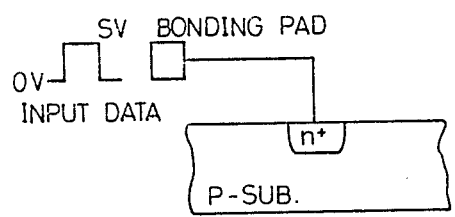
FIG. 6A to 6D are drawings explaining the necessity of the substrate bias generating circuit.
Figure 6B:
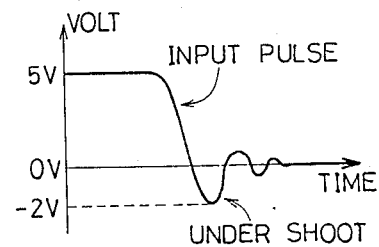
Figure 6C:
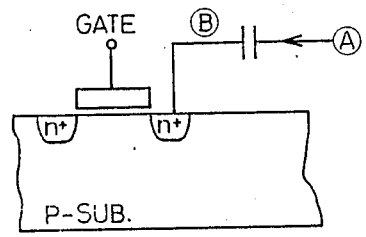
Figure 6D:
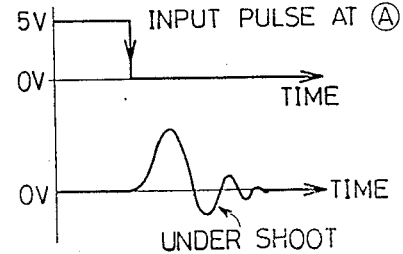
Figure 7:
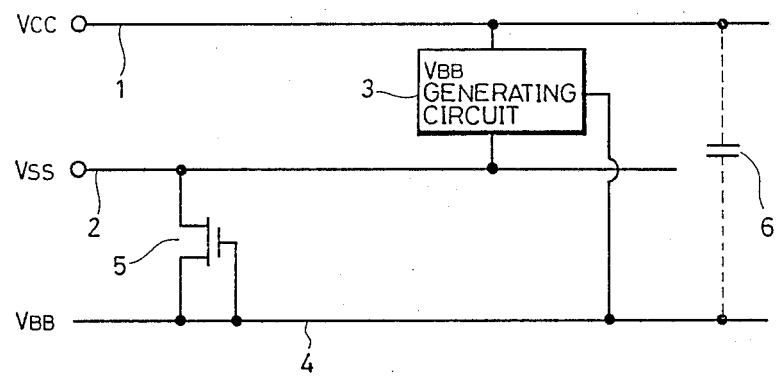
FIG. 7 is a diagram showing a conventional substrate bias voltage control circuit.
Figure 9:
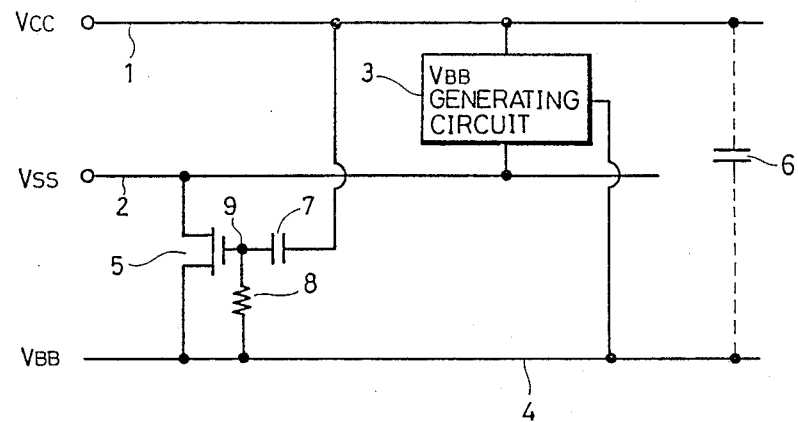
FIG. 9 is a diagram showing a substrate bias voltage control circuit of one embodiment in accordance with the present invention.

A description is made as to an embodiment in accordance with the present invention in reference to the drawings. FIG. 9 shows a substrate bias voltage control circuit in accordance with the present invention, in which reference numerals 1 to 6 denote the same as those in FIG. 7. The substrate bias voltage control circuit comprises a MOS transistor 5 connected between a substrate bias $V_{BB}$ conductor and a ground conductor $V_{SS}$, a capacitor 7 connected between $V_{CC}$ power supply conductor 1 and a gate electrode of the MOS transistor 5, a resistance 8 connected between the substrate bias conductor 4 and the gate electrode of the MOS transistor 5.

A connecting point of the gate electrode of the MOS transistor 5, one end of the capacitor 7 and one end of the resistance 8 is to be defined in node 9.

Figure 10:
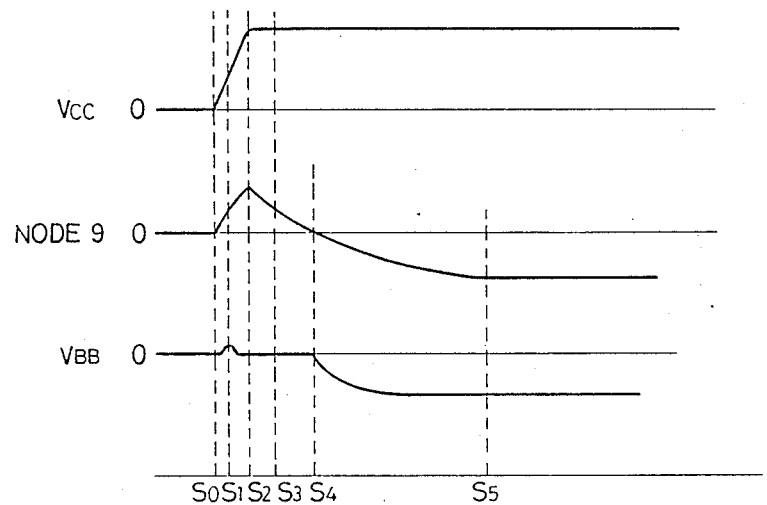
FIG. 10 is a diagram for explaining operation of a substrate bias voltage control circuit in the substrate bias circuit shown in FIG. 6.

Referring to FIG. 10, a description is made of an operation to be performed when the supply voltage $V_{CC}$ is applied in the substrate bias voltage control circuit structured as described above. The supply voltage $V_{CC}$ is turned on at a time $S_0$. The supply voltage $V_{CC}$ rises from 0V to a positive value, for example, 5V from the time $S_0$ to a time $S_2$. At the time $S_0$, the level of the node 9 is 0V.

At the rise of the supply voltage $V_{CC}$, the node 9 is boosted up to a positive value in accordance with the rise of the supply voltage $V_{CC}$ by the capacitance coupling of the capacitor 7. At this time, the node 9 is discharged through the resistance 8 and tends to be equal to a potential of the substrate bias conductor 4. A time constant of this electric discharge is a value obtained by multiplying a capacitance $C_4$ of the capacitor 7 by a resistance $R_4$ of the resistance 8, that is, $R_4 \cdot C_4$, where $R_4 \cdot C_4$ is set to be larger than a value of the time required for the supply voltage $V_{CC}$ to rise from 0V to 5V. Therefore, the node 9 is boosted up to a positive value in accordance with the rise of the supply voltage $V_{CC}$. Meanwhile, the substrate bias $V_{BB}$ is also raised to a positive value from 0V by the capacitance coupling of the capacitor 6.

At the time $S_1$, when the voltage of the node 9 exceeds a threshold voltage of the MOS transistor 5, the MOS transistor 5 turns on. As a result, the substrate bias $V_{BB}$ is discharged to 0V. In a period from the time $S_1$ to the time $S_2$, the node 9 is discharged by the resistance 8 at the time constant $R_4 \cdot C_4$ while it is boosted up by the capacitance coupling of the capacitor 7. However, since the effect of boost-up surpasses the effect of discharge at the node 9, the MOS transistor 5 enters heavy conductive state. Therefore, the value of the $V_{BB}$ is clamped at 0V with a sufficiently low impedance.

The $V_{BB}$ generating circuit 3 starts to operate at a time $S_3$. The value of the $V_{BB}$ remains at 0V because the MOS transistor 5 is in the on state. Meanwhile, the node 9 starts to be discharged from the value boosted up through the resistance 8 with the time constant $R_4 \cdot C_4$ at the time $S_2$. The node 9 attains 0V by a time $S_4$ and the MOS transistor 5 turns off completely. Then, the $V_{BB}$ generating circuit 3 starts to render the value of the $V_{BB}$ negative. The value of the $V_{BB}$ is a negative value at the time $S_4$. At the same time the voltage of the node 9 also becomes a negative value from 0V in accordance with the value of the $V_{BB}$. The value $V_{BB}$ becomes stable at a time $S_5$.

Figure 8:
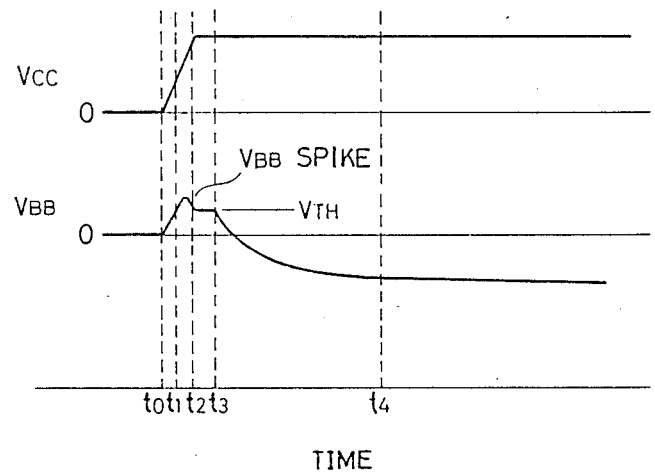
FIG. 8 is a diagram for explaining operation of the substrate bias voltage control circuit shown in FIG. 4.

As it is obvious through the above description, in the substrate bias voltage control circuit in accordance with the present invention, the level to which the substrate bias $V_{BB}$ is clamped at the time of turning on of the supply voltage $V_{CC}$ is always 0V irrespective of the threshold voltage of the MOS transistor 5. Therefore, the clamped bias voltage has no dependency on the threshold voltage of the MOS transistor 5. Since a high gate voltage is applied to the MOS transistor 5, the $V_{BB}$ is clamped at 0V in a sufficiently low impedance state. As a result, there is an advantage that the voltage control circuit operates effectively. Therefore, it does not happen that the p-n junction is in a forward bias even momentarily (FIG. 8) and in the case of the CMOS, latch-up is prevented. In addition, the p-n junction comprises the p type silicon substrate 20 and the n+ diffused layer 24.

Figure 11:
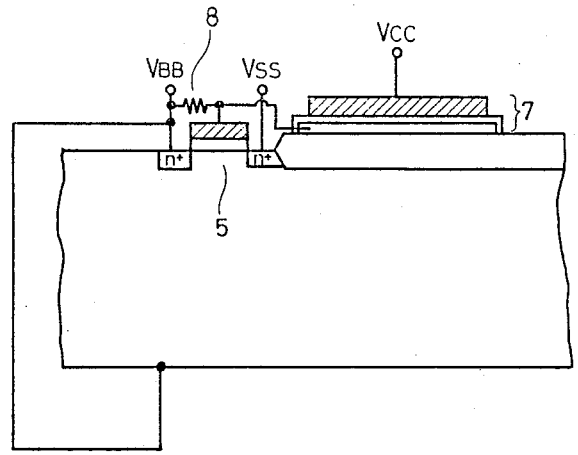
FIG. 11 is a cross sectional view of the substrate bias voltage control circuit shown in FIG. 6.

FIG. 11 is a cross sectional view of the substrate bias circuit shown in FIG. 9. With reference to FIG. 11, the substrate bias circuit comprises a MOS transistor 5 formed on the substrate 20 and a capacitor 7 formed adjacent to the MOS transistor 5. The capacitor 7 comprises a first polysilicon layer formed on the field oxide and a second polysilicon layer formed on the first polysilicon layer through an insulating layer formed therebetween.

Figure 12:
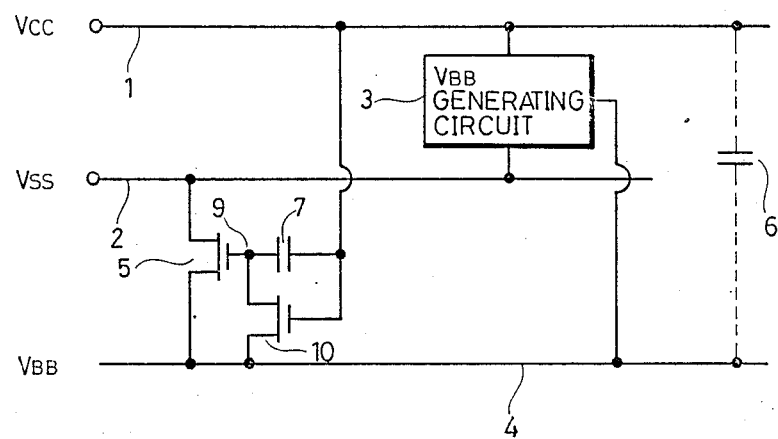
FIG. 12 is a diagram showing a substrate bias voltage control circuit of another embodiment in accordance with the present invention.

FIG. 12 shows another embodiment of the present invention, in which reference numerals 1 to 7 and 9 denote the same elements as those shown in FIG. 9. The substrate bias voltage control circuit comprises the MOS transistor 5, a capacitor 7, a MOS transistor 10 and the node 9 provided at the junction point thereof. The n channel MOS transistor 10 has one end connected to the substrate bias conductor 4 and the other end connected to the node 9.

An impedance $Z_{10}$ of the n channel MOS transistor 10 has the same effect as that of the resistance 8 shown in FIG. 9. Therefore, in the case of FIG. 12, a time constant of the discharge of the node 9 is $C_4 \cdot Z_{10}$. As a result, entirely same operation as that in the circuit shown in FIG. 9 can be executed.

In FIG. 12, a MOS transistor 10 is adopted instead of the resistance 8. Following is an advantage of the embodiment.

It is preferable to set RC value as 200 μs, if time required to raise $V_{CC}$ is assumed to be 10 μs to 100 μs. When C is assumed to be 10 pF, R becomes 20 MΩ. It means that quite a large area is required to form a resistance with 20 MΩ. In other words, if the resistances is formed of the material with 100 Ω/□ and 1 μm width, a length of 200 mm (2m) is required. Though a material with some 100 kΩ□ to some 1 MΩ/□ sheet resistance can be used in view of a process technique, the process steps required to form the resistance have to be increased.

On the other hand, if a MOS transistor 10 is used, an area required to form the circuit is small. This is because high impedance can be obtained substantially, when a MOS transistor is used instead of the resistance. This is an advantage of the embodiment shown in FIG. 11.

Figure 13:
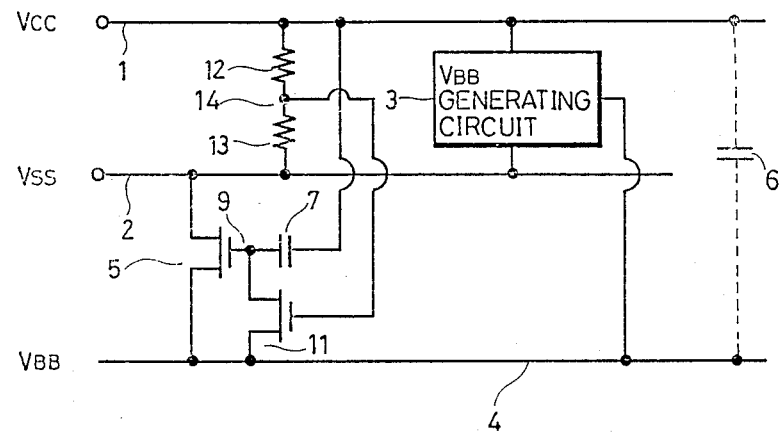
FIG. 13 is a diagram showing a substrate bias voltage control circuit of a still further embodiment in accordance with the present invention.

FIG. 13 shows a still further embodiment of the present invention. In the figure, reference numerals 1 to 7 and 9 denote the same elements as those of the circuit shown in FIG. 9. An n channel MOS transistor 11 has its gate connected to a node 14, its drain connected to the node 9 and its source connected to the substrate bias conductor 4. A resistance 12 has one end connected to a $V_{CC}$ power supply conductor 1 and the other end connected to the node 14. A resistance 13 has one end connected to the node 14 and the other end connected to the ground conductor 2. An impedance $Z_{11}$ of the n channel MOS transistor 11 in FIG. 13 is controlled by the resistance value divided by two resistances 12 and 13. Therefore, the circuit shown in FIG. 13 has the entirely same effect as that of the circuit shown in FIG. 9.

FIG. 13 is another embodiment that improves the advantage of one shown in FIG. 12. A voltage applied to the gate of the MOS transistor 11 is lowered by the resistance separation between a resistance 12 and a resistance 13. As a result, the embodiment has advantages that higher impedance can be obtained and an adjustment of the time constant RC can be done easily by changing the ratio of the resistance separation.

In the above-described embodiments, description was made as to the cases of using the CMOS dynamic. However, needless to say, the present invention is also applicable to an NMOS dynamic RAM. Furthermore, it is also applicable to a MOS type semiconductor memory such as a static RAM or ROM which generates a substrate bias on a chip.

As described above, in accordance with the present invention, a substrate bias voltage control circuit for a semiconductor device comprises a switch for connecting the substrate bias terminal to a ground level. When a voltage at a power supply terminal exceeds a prescribed value, which often occurs at the time of turning on the power supply, the switches turned on, and the potential of the substrate bias terminal is clamped at the ground level. The substrate bias voltage control circuit also comprises a time delay circuit to establish a predetermined time duration. When the prescribed time passes, the switches turned off. The prescribed time corresponds to time required for the substrate bias generating circuit to work its operation fully.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. For a semiconductor device including a semiconductor substrate on which field effect transistors are formed, said device including a power supply terminal, a ground terminal and a substrate bias terminal, parasitic capacitance tending to be formed between said power supply terminal and said substrate bias terminal, said device further including a substrate bias generating circuit coupled to said power supply terminal and said ground terminal for generating a substrate bias voltage having a predetermined value and applying said substrate bias voltage to said substrate bias terminal, a substrate bias voltage clamp circuit, comprising:
   switching means connected between said substrate bias terminal and said ground terminal, said switching means including a control electrode for controlling said switching means to be on or off, selectively; and
   control means coupled to said control electrode and responsive to a change of voltage at said power supply terminal for turning said switching means on for a predetermined time duration;
   said control means including
   (a) capacitor means connected between said power supply terminal and said control electrode, and
   (b) discharge means for discharging said capacitor means,
   (c) said predetermined time duration being established by a discharge time of said capacitor means by said discharge means.

2. The circuit of claim 1, wherein said switching means comprises a field effect transistor connected between said substrate bias terminal and said ground terminal having a gate electrode;
   said capacitor means includes a capacitor connected between said power supply terminal and said gate electrode; and
   said discharge means includes a resistor connected between said substrate bias terminal and said gate electrode.

3. The circuit of claim 2, wherein said switching means comprises a first field effect transistor connected between said substrate bias terminal and said ground terminal and having a gate electrode;
   said capacitor means includes a capacitor connected between said power supply terminal and said gate electrode of said first field effect transistor; and
   said discharge means includes a second field effect transistor connected between said substrate bias terminal and said gate electrode of said first field effect transistor;
   said second field effect transistor having a gate connected to said power supply terminal.

4. The circuit of claim 1, wherein said switching means comprises a first field effect transistor connected between said substrate bias terminal and said ground terminal and having a gate electrode;

said capacitor means includes a capacitor connected between said power supply terminal and said gate electrode; and said discharge means including
   (a) a potential divider means connected between said power supply terminal and said ground terminal; and
   (b) a second field effect transistor connected between the gate electrode of said first field effect transistor and said substrate bias terminal and having a gate electrode;

said gate electrode of said second field effect transistor being connected to an output node of said potential divider means.

5. For a semiconductor device including a semiconductor substrate on which field effect transistors are formed, said device including a power supply terminal, a ground terminal and a substrate bias terminal, parasitic capacitance tending to be formed between said power supply terminal and said substrate bias terminal, said device further including a substrate bias generating circuit for generating a substrate bias voltage having a predetermined value and applying said substrate bias voltage to said substrate bias terminal, a substrate bias voltage clamp circuit, comprising:

switching means connected between said substrate bias terminal and said ground terminal, said switching means including a control electrode for controlling said switching means to be on or off, selectively;

capacitor means connected between said power supply terminal and said control electrode for turning on said switching means in response to a voltage change at said power supply terminal; and discharge means for discharging said capacitor means to turn off said switching means following a time duration determined by values of capacitor means and said discharge means.

6. The circuit of claim 5, wherein said switching means comprises a field effect transistor connected between said substrate bias terminal and said ground terminal and having a gate electrode;

said capacitor means includes a capacitor connected between said power supply terminal and said gate electrode; and said discharge means includes a resistor connected between said substrate bias terminal and said gate electrode.

7. The circuit of claim 5, wherein said switching means comprises a first field effect transistor connected between said substrate bias terminal and said ground terminal and having a gate electrode;

said capacitor means includes a capacitor connected between said power supply terminal and said gate electrode of said first field effect transistor; and said discharge means includes a second field effect transistor connected between said substrate bias terminal and said gate electrode of said first field effect transistor;

said second field effect transistor having a gate connected to said power supply terminal.

8. The circuit of claim 5, wherein said switching means comprises a first field effect transistor connected between said substrate bias terminal and said ground terminal and having a gate electrode;

said capacitor means includes a capacitor connected between said power supply terminal and said gate electrode; and said discharge means including
   (a) a potential divider means connected between said power supply terminal and said ground terminal; and
   (b) a second field effect transistor connected between the gate electrode of said first field effect transistor and said substrate bias terminal and having a gate electrode;

said gate electrode of said second field effect transistor being connected to an output node of said potential divider means.

* * * * *